(12) United States Patent
Crowe

(10) Patent No.: US 8,125,644 B2
(45) Date of Patent: Feb. 28, 2012

(54) MAGNETIC FIELD SENSOR WITH OPTICALLY SENSITIVE DEVICE AND METHOD FOR MEASURING A MAGNETIC FIELD

(75) Inventor: Devon G. Crowe, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 339 days.

(21) Appl. No.: 12/334,758

(22) Filed: Dec. 15, 2008

(65) Prior Publication Data
US 2010/0148770 A1 Jun. 17, 2010

(51) Int. Cl.
*G01B 9/02* (2006.01)
*G01R 33/02* (2006.01)
(52) U.S. Cl. .................................. 356/450; 324/244.1
(58) Field of Classification Search .............. 356/450; 324/244, 244.1
See application file for complete search history.

(56) References Cited

U.S. PATENT DOCUMENTS

| 4,376,248 | A | * | 3/1983 | Giallorenzi et al. | 250/227.19 |
|---|---|---|---|---|---|
| 4,433,291 | A | * | 2/1984 | Yariv et al. | 324/244.1 |
| 4,495,411 | A | * | 1/1985 | Rashleigh | 250/227.19 |
| 4,675,522 | A | * | 6/1987 | Arunkumar | 250/227.19 |
| H371 | H | * | 11/1987 | Bobb | 324/244.1 |
| 5,059,783 | A | * | 10/1991 | Stranjord et al. | 250/227.19 |
| 5,103,174 | A | * | 4/1992 | Wandass et al. | 324/244 |
| 6,463,186 | B1 | * | 10/2002 | Li | 385/6 |
| 7,131,339 | B2 | * | 11/2006 | Kwun et al. | 73/862.331 |

FOREIGN PATENT DOCUMENTS

JP 05264687 A * 10/1993

* cited by examiner

*Primary Examiner* — Michael A Lyons
(74) *Attorney, Agent, or Firm* — Schwegman, Lundberg & Woessner, P.A.

(57) ABSTRACT

An optically sensitive device includes a material that changes dimension in response to a change in a magnetic field. In an embodiment, the optically sensitive device is configured to measure a change in a magnetic field as a function of the change of dimension of the material.

6 Claims, 4 Drawing Sheets

MAGNETIC FIELD SENSOR WITH OPTICALLY SENSITIVE DEVICE AND METHOD FOR MEASURING A MAGNETIC FIELD

TECHNICAL FIELD

The present invention relates to magnetic sensors and methods for measuring magnetic fields.

DETAILED DESCRIPTION

Figure 1:
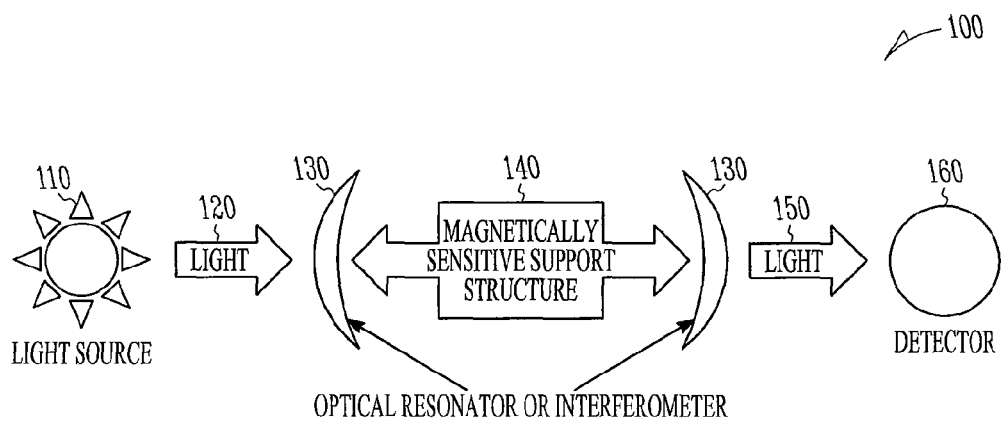
FIG. 1 is a block diagram of an example embodiment of a system that measures a magnetic field using an optically sensitive device that includes a material that changes dimension in a changing magnetic field.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

This disclosure relates to a device and method for magnetic sensing. The device functions by incorporating into resonators or interferometers materials that change dimension in a changing magnetic field.

Many types of high-Q optical resonators exist. Supermirror optical cavities with $Q=10^{11}$ have been made. Of special interest for small scale sensors, optical whispering gallery mode microresonators have been fabricated with a quality factor Q in excess of $10^8$, which supports dimensional change sensitivity down to less than one part in $10^{11}$ when operated at high signal-to-noise ratio. Such microresonators support measurable magnetic response down to a magnetic field strength as low as one femto-Tesla ($10^{-15}$ Tesla or fT), and are sufficiently small that they can be implemented on integrated circuits.

Additionally, methods are described herein for minimizing environmental effects that include temperature fluctuations and acoustic disturbances. Discrimination between the many potential ferromagnetic objects within the range of detection is also disclosed. Applications include cardiac imaging, brain imaging, intrusion detection, hidden weapon or explosive detection, midcourse missile defense target discrimination, and the detection, identification, and tracking of metallic objects.

An embodiment combines the sensitivity of optical devices with materials that change dimension when an immersing magnetic field changes. The materials implementation may include magnetically sensitive structures or coatings. The optical sensing implementation can include resonators or interferometers. An example of a material that changes dimension in the presence of changing magnetic fields is Terfenol-D ($Tb_xDy_{1-x}Fe_2$).

FIG. 1 illustrates an example embodiment of a system 100 that includes a magnetically sensitive support structure that is incorporated into an optically sensitive device such as a resonator or an interferometer. Specifically, FIG. 1 illustrates a light source 110 that provides light 120. The light 120 impinges on an optically sensitive device 130, having a magnetically sensitive support structure (or coating) 140. In FIG. 1, while the optically sensitive device 130 is an optical resonator or an interferometer, other optical devices would also work. Light 150 exits the optical device 130, and is detected by a detector 160.

The resonator 130 in FIG. 1 can take many forms, including Fabry-Perot filters, laser cavities, and toroidal microresonators. The quality factor Q of a resonator is the ratio of the center wavelength to the full width at half-maximum (FWHM) of the bandpass, $\lambda/\Delta\lambda$. Optical supermirrors are dielectric mirrors that have been fabricated with reflectivity larger than 99.9999%, thereby supporting a resonator $Q>10^{11}$. Whispering gallery resonators use grazing incidence reflection to propagate photons around a closed curved path, and a Q of $10^8$ has been published for a microtoroid well under 100-μm in diameter. A dimensional shift of a small fraction of one wavelength divided by Q can be measured if the signal-to-noise ratio at the optical detector is high. Sensing $10^{-3}$ wavelength dimensional shift is possible, although it is not needed for achieving breakthrough magnetic sensor sensitivity levels. Measuring a dimensional change of $\lambda/10^{11}$ [=$10^{-17}$ meters at a wavelength of one micrometer] is already a small fraction of that needed for many applications. Terfenol-D ($Tb_xDy_{1-x}Fe_2$) creates $10^{-16}$ m/fT of physical dimension change across a 100 μm device. Sub-fT sensitivity is therefore supported.

Figure 2A:
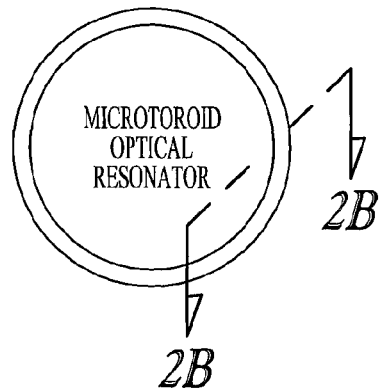
FIG. 2A is a diagram of an example embodiment of a microtoroid optical resonator.
Figure 2B:
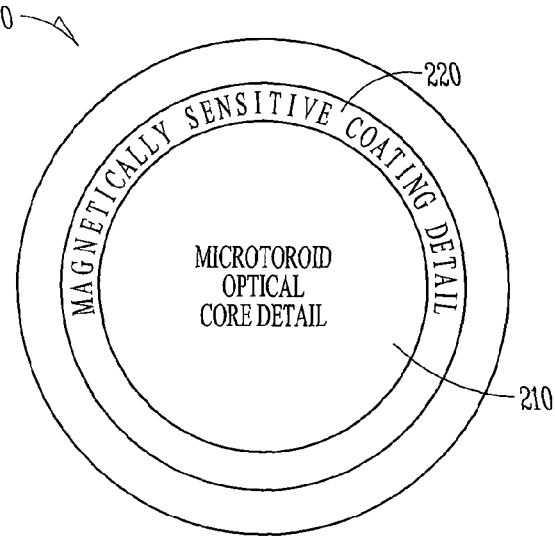
FIG. 2B is a cross-section of FIG. 2A along line A-A of FIG. 2A.
Figure 3:
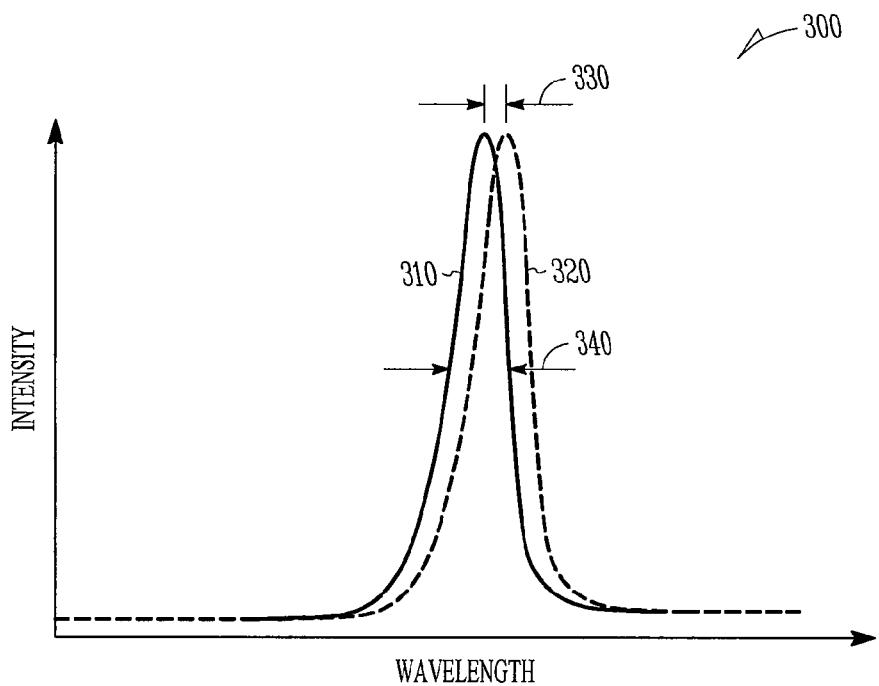
FIG. 3 is a graph illustrating a wavelength shift generated by an optically resonant device having a material that changes dimension as a function of a changing magnetic field.

In an embodiment, an optical microresonator of high Q is coated with a magnetic material that changes dimension in response to changes in magnetic field. A cross-section of such a coating is shown in FIGS. 2A and 2B. FIGS. 2A and 2B illustrate a mircroresonator 200 that includes a magnetically sensitive coating 220 over a microtoroid optical core detail 210. The design of the resonator would take into account the index of refraction effect of the coating. The resonator line width and a detectable wavelength shift are shown in FIG. 3. Specifically, FIG. 3 is a graph 300 that illustrates a shift in wavelength from a first wave 310 to a second wave 320. This shift can be measured at either the peak 330 or at the Full Width at Half Maximum 340, and the change in the magnetic field can be determined from this shift. The extent of this shift is dependent on the magnetically sensitive material that is used, and the features of the particular instrument that is used (e.g., size, shape, coated with a magnetic material, magnetic material incorporated into the structure of the instrument, etc.), and the correlation between the shift and the strength of the magnetic field can be calibrated.

In another embodiment, a fiber optical interferometer is coated with a magnetic material that changes dimension in response to changes in magnetic field. The cross sectional schematic of the fiber optic would resemble that illustrated in FIGS. 2A and 2B, although the fiber would be used in an interferometer rather than in a whispering gallery resonator. The design of the interferometer would take into account the index of refraction effect of the coating.

In another embodiment, either a portion of, or all of, a support structure of an optical resonator is fabricated with a magnetic material that changes dimension in response to changes in magnetic field. The dimensional change shifts the resonant frequency of the resonator by a detectible amount when the shift is a measurable fraction of a resonator line width. The extent of this change in resonant frequency is dependent on the magnetically sensitive material that is used, and the features of the particular instrument that is used (e.g., size, shape, coated with a magnetic material, magnetic material incorporated into the structure of the instrument, etc.), and the correlation between the change in resonant frequency and the strength of the magnetic field can be calibrated.

Figure 4:
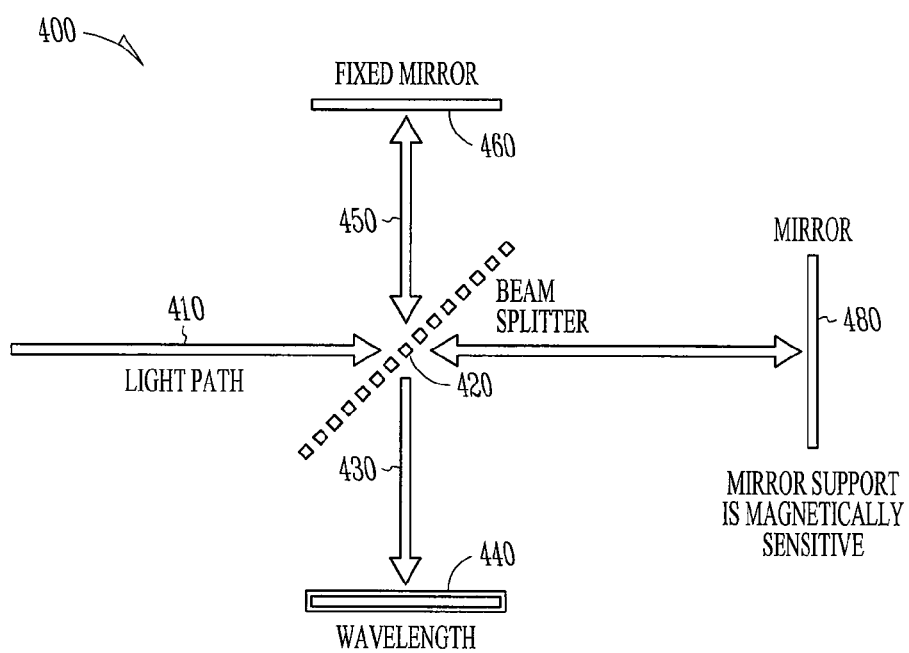
FIG. 4 is an example embodiment of an interferometer having a material that changes dimension as a function of a changing magnetic field.

In another embodiment, either a portion of, or all of, the support structure of an optical interferometer is fabricated with a magnetic material that changes dimension in response to changes in magnetic field. The dimensional change shifts the intensity of the fringe at the detector by a detectible amount when the shift is a measurable fraction of an interference fringe. The extent of this shift in intensity at the fringe is dependent on the magnetically sensitive material that is used, and the features of the particular instrument that is used (e.g., size, shape, coated with a magnetic material, magnetic material incorporated into the structure of the instrument, etc.), and the correlation between the shift in intensity and the strength of the magnetic field can be calibrated. FIG. 4 illustrates an example of how a Michelson interferometer 400 with a stable reference arm and a sensor arm that is mounted on magnetically sensitive material will sense fringe shifts as intensity modulation. In the embodiment of FIG. 4, the mirror support is magnetically sensitive. The Michelson interferometer 400 includes light paths 410, 430, and 450, beam splitter 420, fixed mirror 460, mirror 480 coupled to a support that is magnetically sensitive, and a detector 440.

In another embodiment, the measurement of resonant cavity correction signals is used to measure the extent of dimensional shift due to magnetic effects on susceptible materials. For example, by supporting one mirror in a reflective resonant cavity with a closed-loop positioner, the signal that keeps the mirror in position to maintain a constant center frequency can be used as a measure of the changing magnetic field. The strength of this signal is dependent on the magnetically sensitive material that is used, and the features of the particular instrument that is used (e.g., size, shape, coated with a magnetic material, magnetic material incorporated into the structure of the instrument, etc.), and the correlation between the strength of the signal and the strength of the magnetic field can be calibrated.

In another embodiment, a measurement of interferometer optical element position correction signals is used to measure the extent of dimensional shift due to magnetic effects on susceptible materials. In FIG. 4, an active closed loop positioning system could be used to maintain a constantly maximizing central fringe signal on the detector. The position control signal then contains a measurement of the magnetic field. This embodiment maintains maximum signal-to-noise, which increases the accuracy of the measurement. The embodiment is also relatively insensitive to light source intensity fluctuations.

In another embodiment, a differential operation between the intended magnetic sensor and an otherwise identical nearby sensor that does not contain a magnetic material is used in order to reduce sensitivity to undesired environmental effects such as temperature change and acoustic disturbance. The difficulties of implementing a magnetic sensor include the need to separate environmental effects such as thermal and acoustic motion from magnetic signals. Differential signal processing between physically adjacent magnetically sensitive and non-magnetically sensitive, but otherwise identical, sensors will eliminate common environmental influences, leaving only the magnetic signature.

In another embodiment, tomographic processing of the signals from multiple sensors is used to identify target objects and also to identify patterns in the presence of clutter due to objects with undesired ferromagnetic signatures. Discriminating between interesting target objects and uninteresting clutter can be done by examining characteristic signatures of the interesting objects, such as shape, position, motion, and temporal behavior. All of these characteristics can be monitored through a combination of image formation and temporal spectrum measurement.

Figure 5:
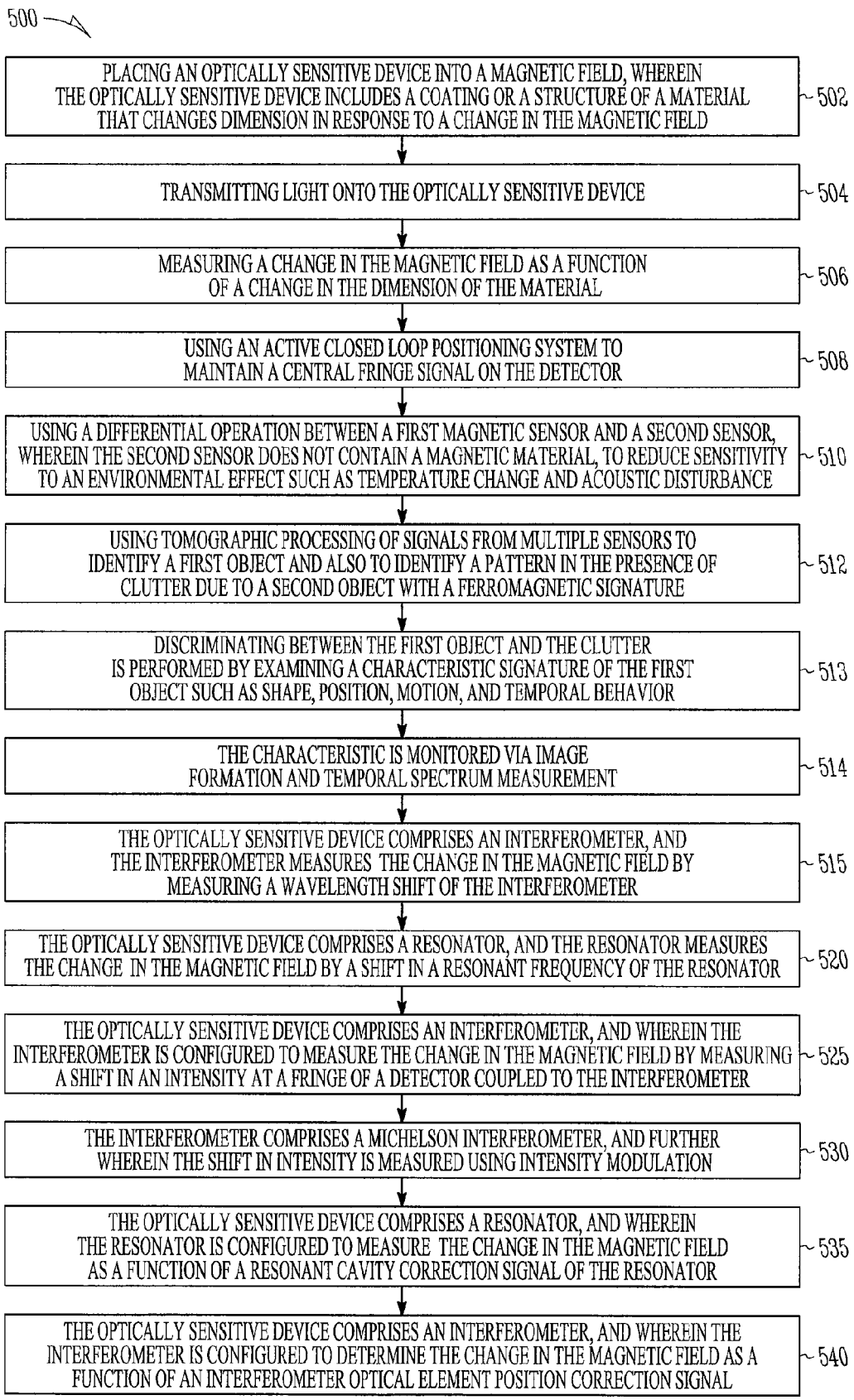
FIG. 5 is a flowchart of an example embodiment of a process for measuring a change in a magnetic field with an optical device containing a material that changes dimension in a changing magnetic field.
Figure 6:
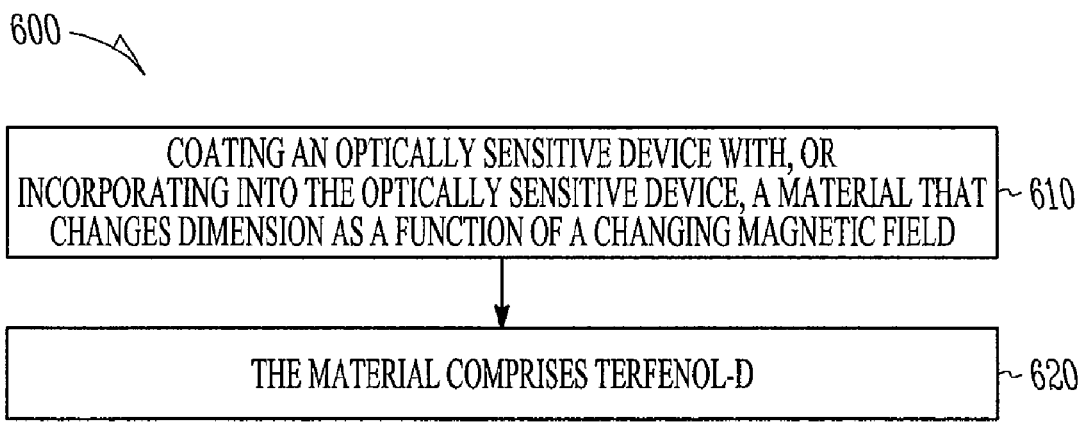
FIG. 6 is a flowchart of an example embodiment of a process to construct an optically sensitive device with a material that changes dimension in a changing magnetic field.

FIG. 5 is a flowchart of an example process 500 for measuring a change in a magnetic field using an optically sensitive device having a material that changes dimension in a changing magnetic field. FIG. 6 is a flowchart of an example process 600 for making an optically sensitive device having a material that changes dimension in a changing magnetic field. FIG. 5 includes a number of process blocks 502-540, and FIG. 6 includes a number of process blocks 610-620. Though arranged serially in the examples of FIGS. 5 and 6, other examples may reorder the blocks, omit one or more blocks, and/or execute two or more blocks in parallel.

FIG. 5 is a flowchart of an example embodiment of a process 500 for measuring a change in a magnetic field with an optical device containing a material that changes dimension in a changing magnetic field. At 502, an optically sensitive device is placed into a magnetic field. The optically sensitive device includes a coating or a structure of a material that changes dimension in response to a change in the magnetic field. At 504, light is transmitted onto the optically sensitive device, and at 506, a change in the magnetic field is measured as a function of a change in the dimension of the material. At 508, an active closed loop positioning system is used to maintain a central fringe signal on a detector. At 510, a differential operation is used between a first magnetic sensor and a second sensor. The second sensor does not contain a magnetic material. This differential operation reduces the sensitivity to environmental effects such as temperature change and acoustic disturbance. At 512, a tomographic processing from multiple sensors is used to identify a first object and also identify a pattern in the presence of clutter due to a second object with a ferromagnetic signature. At 513, the process 500 discriminates between the first object and the clutter by examining a characteristic signature of the first object such as shape, position, motion, and temporal behavior. At 514, the characteristic is monitored via image formation and temporal spectrum measurement. At 515, the optically sensitive device comprises an interferometer, and the interferometer measures the change in the magnetic field by measuring a wavelength shift of the interferometer. At 520, the optically sensitive device comprises a resonator, and the resonator measures the change in the magnetic field by a shift in a resonant frequency of the resonator. At 525, the optically sensitive device comprises an interferometer that is configured to measure the change in the magnetic field by measuring a shift in an intensity at a fringe of a detector coupled to the interferometer. At 530, the interferometer comprises a Michelson interferometer, and the shift in intensity is measured using intensity modulation. At 535, the optically sensitive device comprises a resonator that is configured to measure the change in the magnetic field as a function of a resonant cavity correction signal of the resonator. At 540, the optically sensitive device comprises an interferometer that is configured to determine the change in the magnetic field as a function of an interferometer optical element position correction signal.

FIG. 6 is a flowchart of an example embodiment of a process 600 to construct an optically sensitive device with a material that changes dimension in a changing magnetic field. At 610, an optically sensitive device is coated with, or incorporated into the optically sensitive device is, a material that changes dimension as a function of a changing magnetic field. At 620, the material comprises Terfenol-D.

In the foregoing detailed description of embodiments of the invention, various features are grouped together in one or more embodiments for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of embodiments of the invention, with each claim standing on its own as a separate embodiment. It is understood that the above description is intended to be illustrative, and not restrictive. It is intended to cover all alternatives, modifications and equivalents as may be included within the scope of the invention as defined in the appended claims. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

The abstract is provided to comply with 37 C.F.R. 1.72(b) to allow a reader to quickly ascertain the nature and gist of the technical disclosure. The Abstract is submitted with the understanding that it will not be used to interpret or limit the scope or meaning of the claims.

The invention claimed is:

1. A magnetic field sensor comprising:
   an optically sensitive device including a material that changes dimension in response to a change in a magnetic field;
   wherein the optically sensitive device is configured to measure the change in the magnetic field as a function of the change of dimension of the material; and
   wherein the optically sensitive device is configured to tomographically process signals from multiple sensors to identify a first object and also to identify a pattern in the presence of clutter due to a second object with a ferromagnetic signature.

2. The magnetic field sensor of claim 1, wherein the optically sensitive device is configured to discriminate between the first object and the clutter by examining a characteristic signature of the first object such as shape, position, motion, and temporal behavior.

3. The magnetic field sensor of claim 2, wherein the characteristic is monitored via image formation and temporal spectrum measurement.

4. A method for measuring a magnetic field comprising:
   placing an optically sensitive device into a magnetic field, wherein the optically sensitive device includes a coating or a structure of a material that changes dimension in response to a change in the magnetic field;
   transmitting light onto the optically sensitive device;
   measuring a change in the magnetic field as a function of a change in the dimension of the material; and
   using tomographic processing of signals from multiple sensors to identify a first object and also to identify a pattern in the presence of clutter due to a second object with a ferromagnetic signature.

5. The method of claim 4, wherein discriminating between the first object and the clutter is performed by examining a characteristic signature of the first object such as shape, position, motion, and temporal behavior.

6. The method of claim 5, wherein the characteristic is monitored via image formation and temporal spectrum measurement.

\* \* \* \* \*